United States Patent
Mills et al.

(10) Patent No.: US 9,720,044 B2
(45) Date of Patent: Aug. 1, 2017

(54) METHOD AND APPARATUS FOR SENSING THE STATUS OF A CIRCUIT INTERRUPTER

(71) Applicant: Labinal, LLC, Denton, TX (US)

(72) Inventors: Patrick Wellington Mills, Bradenton, FL (US); Kevin Francis Hanley, Bradenton, FL (US); James Michael McCormick, Bradenton, FL (US)

(73) Assignee: LABINAL, LLC, Denton, TX (US)

( * ) Notice: Subject to any disclaimer, the term of this patent is extended or adjusted under 35 U.S.C. 154(b) by 435 days.

(21) Appl. No.: 14/556,351

(22) Filed: Dec. 1, 2014

(65) Prior Publication Data

US 2015/0153414 A1 Jun. 4, 2015

Related U.S. Application Data

(60) Provisional application No. 61/911,709, filed on Dec. 4, 2013.

(51) Int. Cl.
*G01R 31/327* (2006.01)
*H01H 71/04* (2006.01)
*H02B 1/056* (2006.01)

(52) U.S. Cl.
CPC .......... *G01R 31/327* (2013.01); *H01H 71/04* (2013.01); *H02B 1/056* (2013.01); *H01H 2071/048* (2013.01)

(58) Field of Classification Search
CPC .............. H01H 2300/03; H01H 71/04; H01H 2071/7481; H01H 71/128; Y02B 90/224;
(Continued)

(56) References Cited

U.S. PATENT DOCUMENTS 5,374,922 A * 12/1994 Ebersohl ............... H01H 9/167
340/635
6,317,311 B1 11/2001 Middlehurst et al.
(Continued)

FOREIGN PATENT DOCUMENTS

WO 98/05052 2/1998
WO 2011/106261 9/2011
WO 2012/177704 12/2012

OTHER PUBLICATIONS

International Search Report filed in PCT/US2014/067885 mailed Feb. 17, 2015.

*Primary Examiner* — Alesa Allgood
(74) *Attorney, Agent, or Firm* — Rankin, Hill & Clark LLP

(57) ABSTRACT

A circuit interrupter apparatus for plug-in connection to a panel board. The circuit interrupter apparatus includes a line terminal for plug-in connection with a line power member provided as part of the panel board, a load terminal for plug-in connection with a load power member provided as part of the panel board, a moveable contact moveable between a closed position, where the line terminal is electrically coupled to the load terminal, and an open position, where the line terminal is not electrically coupled to the load terminal. The circuit interrupter apparatus also includes a sensor module for a plug-in connection to a number of signal conductors provided as part of the panel board. The sensor module detects whether the moveable contact is in the closed position or the open position and output a signal to at least one of the signal conductors indicating a current position of the moveable contact.

12 Claims, 4 Drawing Sheets

(58) Field of Classification Search
CPC ........... Y04S 20/14; H02B 11/26; H02B 1/04; G01R 31/3277; G01R 22/065; G01R 31/025; G01R 31/327
See application file for complete search history.

(56) References Cited

U.S. PATENT DOCUMENTS

| | | | | |
|---|---|---|---|---|
| 6,530,811 | B1* | 3/2003 | Padulo | H01H 73/08 361/634 |
| 6,531,841 | B1* | 3/2003 | Elli | H01H 33/36 318/265 |
| 6,998,954 | B2* | 2/2006 | Milanczak | H01H 85/547 337/187 |
| 8,385,038 | B2* | 2/2013 | Saito | H01H 9/56 361/115 |
| 8,785,797 | B2* | 7/2014 | Cortinovis | H01H 33/42 200/337 |
| 8,914,254 | B2* | 12/2014 | Uzelac | G06F 3/041 345/173 |
| 2002/0064013 | A1* | 5/2002 | Milanczak | H01H 85/547 361/104 |
| 2009/0273234 | A1* | 11/2009 | Wavering | H02G 3/00 307/9.1 |
| 2010/0141050 | A1* | 6/2010 | Saito | H01H 9/563 307/141 |
| 2011/0155555 | A1* | 6/2011 | Cortinovis | H01H 33/42 200/573 |
| 2011/0235244 | A1* | 9/2011 | Mills | H02B 1/056 361/656 |
| 2012/0262848 | A1* | 10/2012 | Mills | H02B 1/056 361/636 |
| 2013/0043111 | A1 | 2/2013 | Venkitachalam et al. | |

* cited by examiner

METHOD AND APPARATUS FOR SENSING THE STATUS OF A CIRCUIT INTERRUPTER

BACKGROUND

Field

The disclosed concept relates generally to electrical switching apparatus and, more particularly, to circuit interrupters, such as, for example, aircraft or aerospace circuit breakers, that include a mechanism for sensing the status of the circuit interrupter.

Background Information

Aerospace power distribution units (PDUs), for example, generally include an enclosure, a number of input and output connectors, internal electrical bussing, electrical conductors, a number of electrical switching apparatus, such as contactors, circuit breakers, relays and the like, and/or fuses. More specifically, in aircraft or aerospace electrical systems, relatively small circuit breakers, commonly referred to as subminiature or aircraft circuit breakers, are often used to protect electrical circuitry from damage due to an overcurrent condition, such as an overload condition or a relatively high level short circuit or fault condition. Typically, subminiature circuit breakers have provided protection against persistent overcurrents implemented by a latch triggered by a bimetal responsive to $I^2R$ heating resulting from the overcurrent. Aircraft circuit breakers also often serve as switches for turning equipment on and off, and are grouped together as part of a circuit protection module with the circuit breakers/switches being accessible on an outer panel of the enclosure within the aircraft.

It is often desirable to be able to automatically sense and indicate the position (open or closed) of a subminiature circuit breaker (so called "auxiliary monitoring"). Conventional circuit breaker position monitoring is achieved by adding a micro switch to a conventional circuit breaker. This implementation requires two additional small gauge wires to sense whether the micro switch is open or closed. The two additional wires require labor to install/remove and the small gauge wire is prone to environmental use and mechanical handling damage. Additionally, most applications for sensing position in this conventional fashion use "logic level" current, which often causes false misses/opens during the sensing process. As a result, it is often necessary to employ gold contacts in the micro switches to provide a more reliable logic level circuit. This, however, adds cost to the overall device.

Accordingly, there is room for improvement in circuit breakers, such as panel-mounted circuit breakers used aircraft or aerospace applications, which indicate status.

SUMMARY

According to one aspect, a circuit interrupter apparatus is structured for plug-in connection to a panel board. The circuit interrupter apparatus includes a line terminal structured for plug-in connection with a line power member provided as part of the panel board, a load terminal structured for plug-in connection with a load power member provided as part of the panel board, a moveable contact moveable between a closed position, in which the line terminal is electrically coupled to the load terminal, and an open position, in which the line terminal is not electrically coupled to the load terminal. The circuit interrupter apparatus also includes a sensor module structured for a plug-in connection to a number of signal conductors provided as part of the panel board. The sensor module is structured and configured to detect whether the moveable contact is in the closed position or the open position and output a signal to at least one of the signal conductors indicating a current position of the moveable contact.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
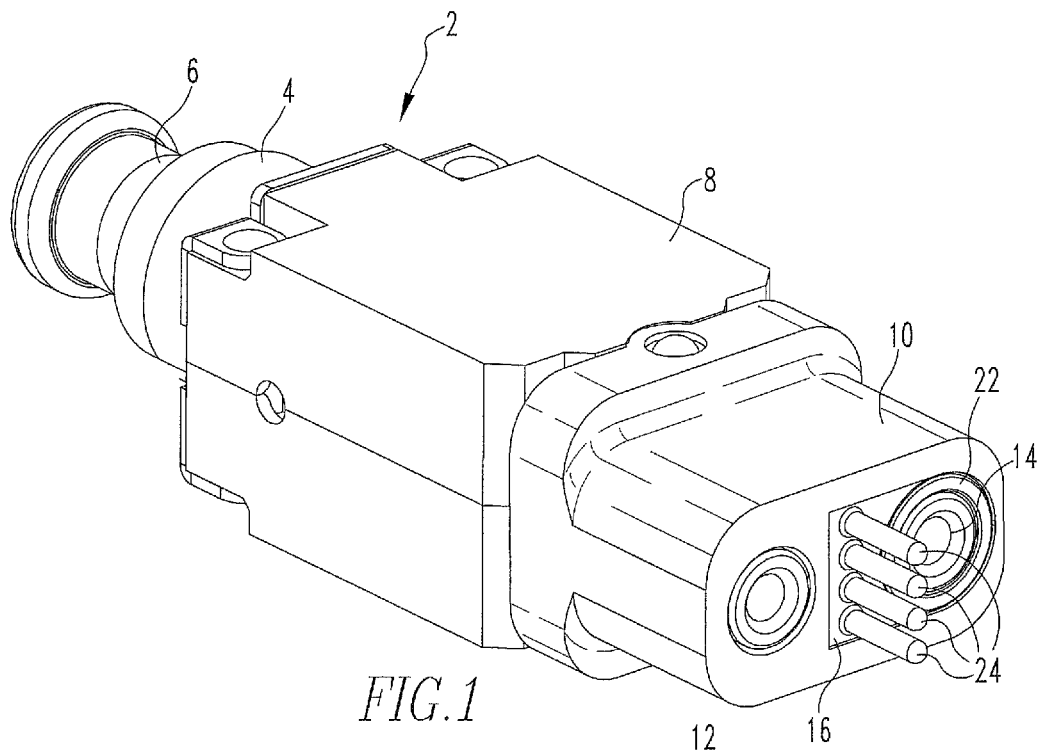
FIG. 1 is an isometric view of a subminiature circuit breaker according to an exemplary embodiment of the present invention.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the term "via" shall mean is an electrical connection between layers in a physical electronic circuit that goes through the plane of one or more adjacent layers.

Figure 2:
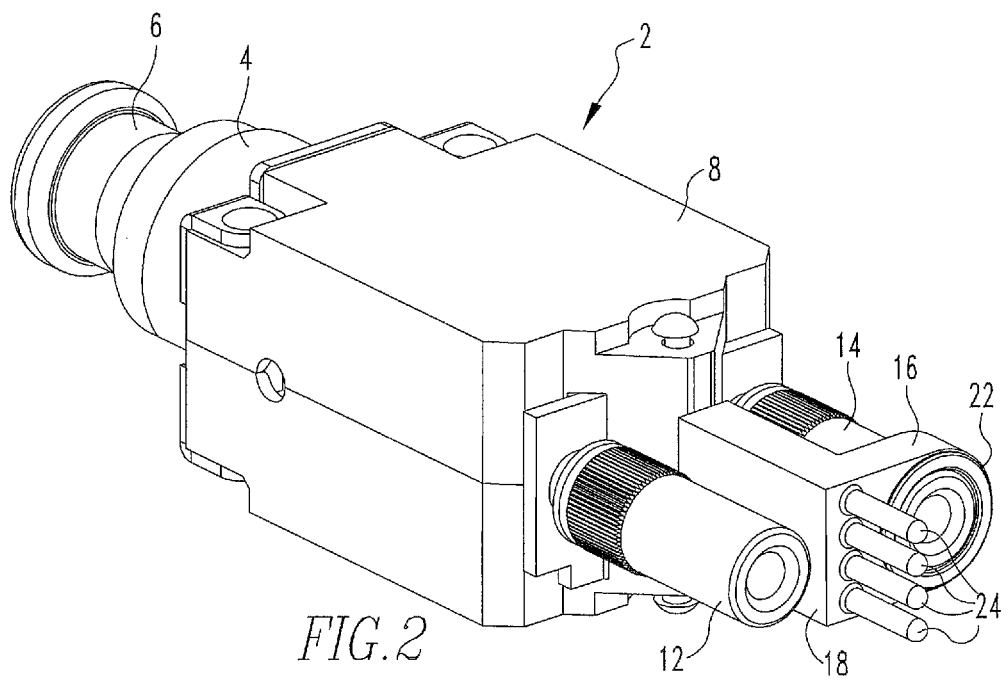
FIG. 2 is an isometric view of the subminiature circuit breaker of FIG. 1 in a condition wherein an auxiliary housing thereof has been removed.
Figure 3:
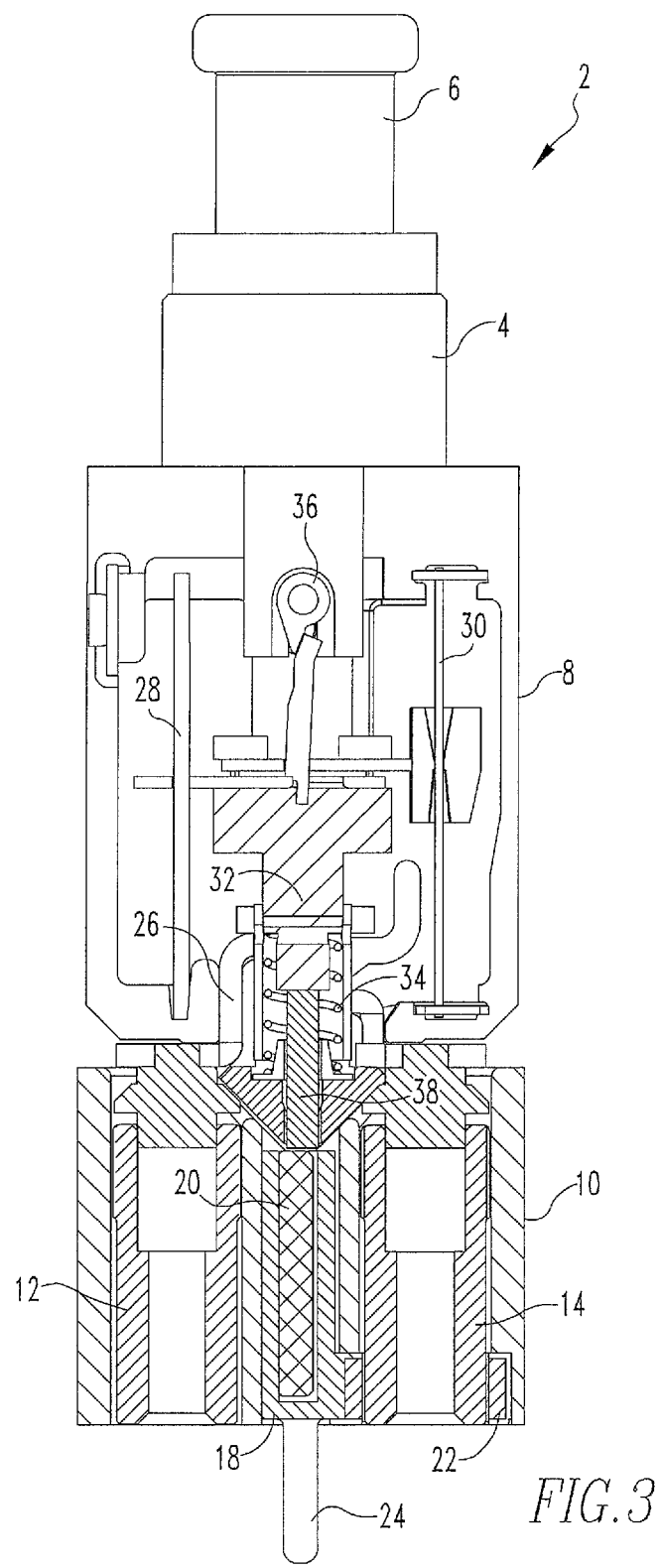
FIG. 3 is a cross-sectional view of the subminiature circuit breaker of FIG. 1.

FIG. 1 is an isometric view of a subminiature circuit breaker 2 according to an exemplary embodiment of the present invention that may be used in, for example and without limitation, aircraft or aerospace applications, to protect electrical circuitry from damage due to an overcurrent condition. FIG. 2 is an isometric view of subminiature circuit breaker 2 in a condition wherein an auxiliary housing thereof, described below, has been removed, and FIG. 3 is a cross-sectional view of subminiature circuit breaker 2.

Subminiature circuit breaker 2 includes a mounting bushing 4 that receives therein an actuator 6 structured to enable subminiature circuit breaker 2 to be manually opened and closed (which allows subminiature circuit breaker 2 to act as an electrical switch). Subminiature circuit breaker 2 further includes a main housing 8 coupled to an auxiliary housing 10 (removed in FIG. 2).

Auxiliary housing 10 houses a line socket 12 (also referred to as a line terminal), a load socket 14 (also referred to as a load terminal), and a sensor module 16. As described herein, sensor module 16 in the illustrated exemplary embodiment is structured to sense both a position (open or closed) of subminiature circuit breaker 2 and a level of current being delivered through subminiature circuit breaker 2. In alternative embodiments, sensor module 16 may be structured to sense only one of position and current level.

As seen in FIG. 2, in the exemplary embodiment, sensor module 16 includes an L-shaped housing 18 which houses a two-wire Hall Effect sensor 20 (for position sensing as described herein) and a current transformer (CT) 22 (for current sensing as described herein). As seen in FIGS. 2 and 3, current transformer 22 is configured and held in a manner such that it will wrap around the exterior of load socket 14. Current transformer 22 may be a Hall Effect CT for use in DC applications, or a conventional CT for use in AC applications. Sensor module 16 further includes a number of pins 24 which are operatively coupled to Hall Effect sensor 20 and current transformer 22. In the exemplary embodiment, four pins 24 are provided, with two being coupled to Hall Effect sensor 20 and two being coupled to current transformer 22.

As is known in the art, a Hall Effect sensor, such as Hall Effect sensor 20, is a transducer that varies its output voltage in response to a magnetic field. More specifically, a typical Hall Effect sensor, such as Hall Effect sensor 20, receives a supply voltage input (via one of the pins 24 in the present embodiment), and outputs (via another one of the pins 24 in the present embodiment) an output voltage signal that has a first (e.g., zero or non-zero) voltage level when no magnetic field is present in proximity to the sensor, and a second (non-zero) voltage level (different than the first level) when a magnetic field is generated in proximity to the sensor. The significance of this functionality to the position sensing of the disclosed concept is described elsewhere herein.

Main housing 8 houses the components which are responsible for tripping subminiature circuit breaker 2 in the event of an overcurrent condition. Referring to FIG. 3, main housing 8 houses a moveable contact 26 that is movable between a first (closed) position wherein it creates a conductive path between line socket 12 and load socket 14 and a second (open) position wherein the conductive path between line socket 12 and load socket 14 is not present. Also provided in main housing 8 is a bi-metal (thermal element) 28, a compensator 30, a moveable plunger 32 coupled to moveable contact 26, a return spring 34, and a latch mechanism 36. As seen in FIG. 3, a magnet 38 is coupled to the distal end of moveable plunger 32. Magnet 38 is provided as part of the position sensing mechanism of the present invention, which described in greater detail elsewhere herein.

In operation, when an overcurrent condition is sustained, bi-metal element 28 will be caused to deflect. The deflection of bi-metal element 28 triggers latch mechanism 36, which causes moveable plunger 32 to move upward under the influence of spring 34. This action causes moveable contact 26 to move from the first (closed) position to the second (open) position, thereby protecting any loads coupled to load socket 14.

Figure 4:
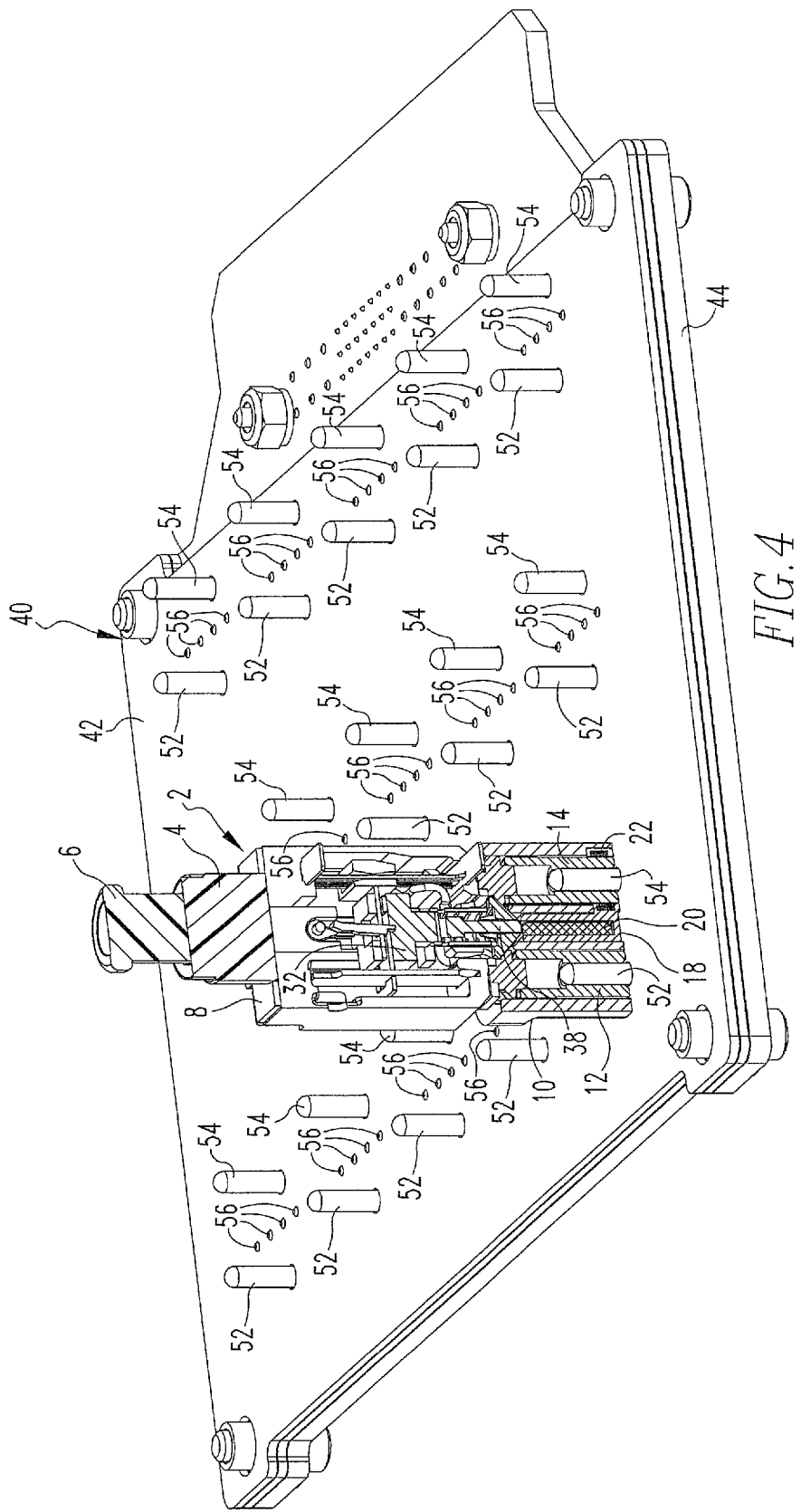
FIGS. 4 and 5 are schematic diagrams illustrate how the subminiature circuit breaker of FIG. 1-3 may be used in an exemplary aerospace application wherein it is coupled to an aircraft load or panel board using only a simple plug-in connection.
Figure 5:
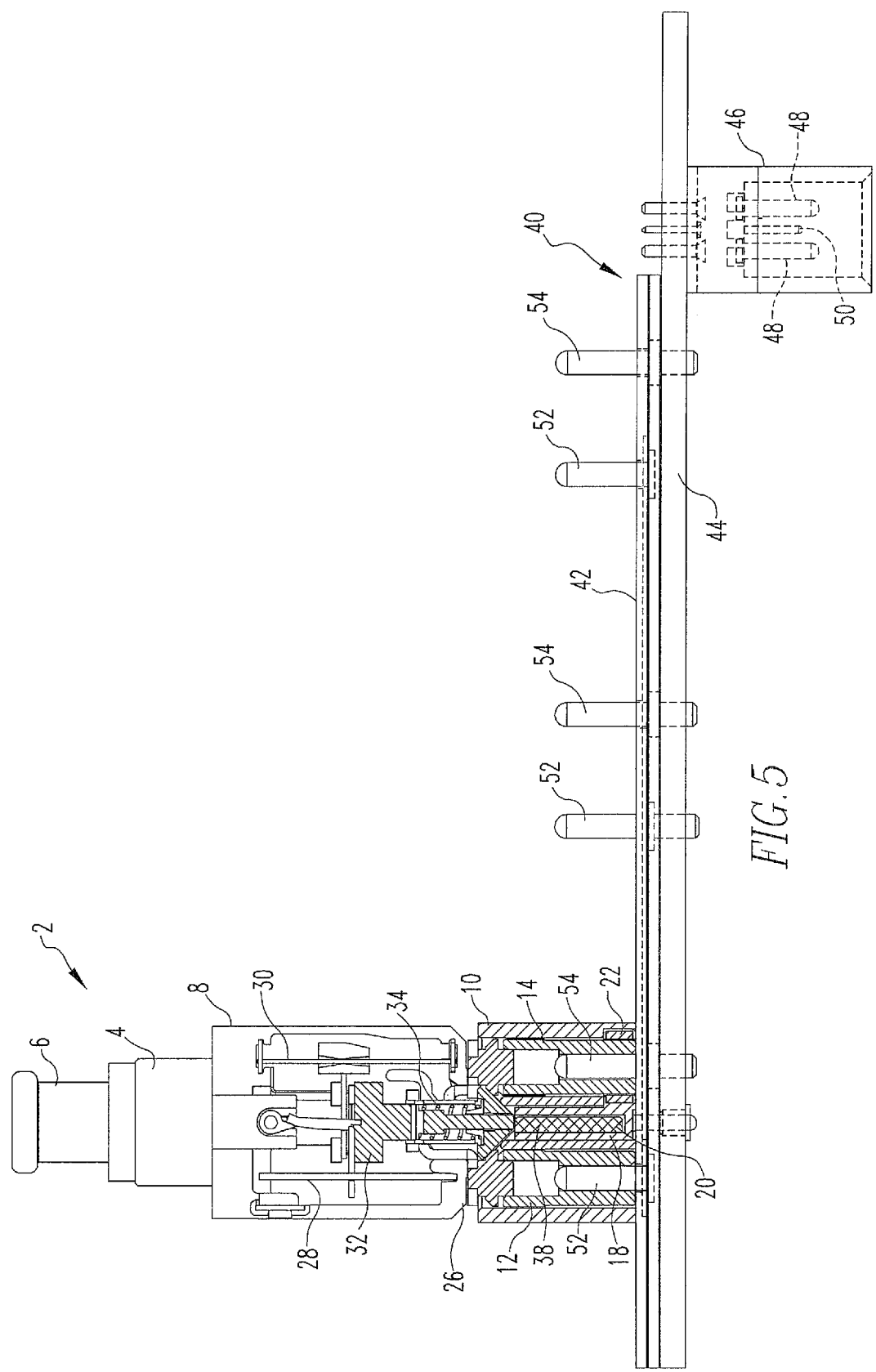

FIGS. 4 and 5 illustrate how subminiature circuit breaker 2 may be used in an exemplary aerospace application wherein subminiature circuit breaker 2 is coupled to an aircraft load or panel board 40 using only a simple plug-in connection. In particular, as seen in FIGS. 4 and 5, panel board 40 includes a front plane member 42 coupled to a back plane member 44. Back plane member 44 comprises a printed circuit board (PCB) member having a number of conductors (e.g., conductive traces) integrated therein. In the exemplary embodiment, the integrated conductors include a power feeder busbar and a plurality of signal conductors which are coupled to a conventional load connector 46. The load connector 46 is a rectangular-shaped connector having a number of power pins 48 and a number of signal pins 50. In the exemplary embodiment, power pins 48 are structured for connection to a power source of an aircraft and signal pins 50 are structured for connection to a control board of an aircraft.

As seen in FIG. 4, panel board 40 has a number of line power pins 52 and a number of load power pins 54 extending upwardly and outwardly therefrom. The line power pins 52 and the load power pins 54 are provided in associated pairs and are operatively coupled to the power feeder busbar integrated within back plane member 44. Panel board 40 also has a number of through-holes or vias 56 provided in groups of four, with each group being associated with a respective line power pin 52 and load power pin 54 pair. Through-holes or vias 56 are each electrically coupled to appropriate ones of the signal conductors integrated within back plane member 44.

As seen in FIGS. 4 and 5, subminiature circuit breaker 2 is coupled to panel board 40 by a 100% plug in connection by: (i) inserting a selected one of the line power pins 52 into line socket 12, (ii) inserting the associated load power pin 54 into load socket 14, and (iii) inserting pins 24 into the associated vias 56. In such a configuration, when subminiature circuit breaker 2 is in a closed condition, there will be an electrical connection from the line power pin 52 to the load power pin 54 through subminiature circuit breaker 2. As will be appreciated, that electrical connection will be severed when subminiature circuit breaker 2 moves to the open condition.

Also in such a configuration, the pins 24 of sensor module 16 will be coupled to the signal conductors of backplane member 40 and ultimately to the control board through the load connector 46. These connections will enable both the position of subminiature circuit breaker 2 and the current flowing through subminiature circuit breaker 2 to be monitored by the control board. More specifically, when subminiature circuit breaker 2 is plugged into panel board 40 as just described, Hall Effect sensor 20 of sensor module 16 will receive a supply voltage input from a signal conductor of backplane member 40 via one of the pins 24, and will provide its output voltage signal to another signal conductor of backplane member 40, and thus to the control board, via another one of the pins 24. When subminiature circuit breaker 2 is in an open condition, the moveable plunger 32 will, as described elsewhere herein, be in an upward position with an air gap being provided between magnet 38 and Hall Effect sensor 20. This will cause Hall Effect sensor 20 to provide an output voltage signal (ultimately provided to the control board) that has the first (e.g., zero or non-zero) voltage level as described herein indicating an open position of subminiature circuit breaker 2. When subminiature circuit breaker 2 is instead in a closed condition, the moveable plunger 32 will, as described elsewhere herein, be in a downward position with no air gap being provided between magnet 38 and Hall Effect sensor 20. This will cause Hall Effect sensor 20 to provide an output voltage signal (ultimately provided to the control board) that has the second (non-zero) voltage level indicating a closed position of subminiature circuit breaker 2. Moreover, when subminiature circuit breaker 2 is plugged into panel board 40 as just described, the outputs of current transformer 22 will be provided to appropriate ones of the signal conductors of backplane member 40 via the associated pins 24, and ultimately to the control board. This will enable the current level signal information to be communicated to the control board.

Thus, as just described, in the apparatus of the present invention, the position of and current through subminiature circuit breaker 2 are able to be readily monitored using a 100% plug-in solution (as noted elsewhere herein, in alternative configurations, only one or the other of position and current level may be detected). Such an implementation is particularly advantageous as it eliminates the need for the two signal wires required in the prior art for position sensing, which provide an undesirable physical make/break contact structure.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter apparatus structured for plug-in connection to a panel board, comprising:
    a line terminal structured for plug-in connection with a line power member provided as part of the panel board;
    a load terminal structured for plug-in connection with a load power member provided as part of the panel board;
    a moveable contact moveable between a closed position wherein the line terminal is electrically coupled to the load terminal and an open position wherein the line terminal is not electrically coupled to the load terminal; and
    a sensor module structured for a plug-in connection to a number of signal conductors provided as part of the panel board, the sensor module being structured and configured to detect whether the moveable contact is in the closed position or the open position and output a signal to at least one of the signal conductors indicating a current position of the moveable contact.

2. The circuit interrupter apparatus according to claim 1, wherein the line terminal is a line socket, wherein line power member is a line power pin provided on the panel board, wherein the line socket is structured to receive therein the line power pin, wherein the load terminal is a load socket, wherein load power member is a load power pin provided on the panel board, and wherein the load socket is structured to receive therein the load power pin.

3. The circuit interrupter apparatus according to claim 1, wherein the sensor module includes a number of sensor pins, wherein the panel board includes a number of via coupled to the number of signal conductors, and wherein the sensor module structured for a plug-in connection to the number of signal conductors through insertion of each of the number of sensor pins into a respective one of the vias.

4. The circuit interrupter apparatus according to claim 1, further comprising a first housing which houses the moveable contact and a second housing which houses the line terminal, the load terminal and the sensor module.

5. The circuit interrupter apparatus according to claim 1, wherein the circuit interrupter apparatus is a subminiature circuit breaker.

6. The circuit interrupter apparatus according to claim 1, further comprising a thermal element and a spring biased moveable plunger coupled to the moveable contact, wherein in response to an overcurrent condition, the thermal element is structured to trigger the moveable plunger and move the moveable contact.

7. The circuit interrupter apparatus according to claim 1, wherein the sensor module includes a Hall Effect sensor for detecting the current position of the moveable contact.

8. The circuit interrupter apparatus according to claim 7, wherein the moveable contact is coupled to a moveable plunger, wherein a magnet is coupled to a distal end of the moveable plunger, wherein the moveable plunger is moveable between a first plunger position wherein the moveable contact is in the closed position and the magnet causes the Hall Effect sensor to output a first voltage level and a second plunger position wherein the moveable contact is in the open position and the magnet causes the Hall Effect sensor to output a second voltage level different than the first voltage level.

9. The circuit interrupter apparatus according to claim 1, wherein the sensor module is also structured and configured to detect a level of a current flowing from the line terminal to the load terminal and output a second signal to at least one of the signal conductors indicating the level.

10. The circuit interrupter apparatus according to claim 9, wherein the sensor module includes a current transformer for detecting the level.

11. The circuit interrupter apparatus according to claim 10, wherein the sensor module includes a Hall Effect sensor for detecting the current position of the moveable contact, wherein the sensor module is structured to position the Hall Effect sensor in between the line terminal and the load terminal and to position the current transformer such that it is wrapped around the load terminal.

12. The circuit interrupter apparatus according to claim 11, wherein the sensor module includes and L-shaped housing which houses the Hall Effect sensor and the current transformer.

* * * * *